United States Patent
Itoyama et al.

(10) Patent No.: US 12,395,101 B2
(45) Date of Patent: Aug. 19, 2025

(54) ELECTROSTATIC CHUCK

(71) Applicant: TOTO LTD., Kitakyushu (JP)

(72) Inventors: Tetsuro Itoyama, Kitakyushu (JP);
Jumpei Uefuji, Kitakyushu (JP)

(73) Assignee: Toto Ltd., Fukuoka (JP)

( * ) Notice: Subject to any disclaimer, the term of this patent is extended or adjusted under 35 U.S.C. 154(b) by 125 days.

(21) Appl. No.: 18/242,122

(22) Filed: Sep. 5, 2023

(65) Prior Publication Data
US 2023/0412096 A1    Dec. 21, 2023

(30) Foreign Application Priority Data

Sep. 28, 2022   (JP) ................. 2022-154770
Aug. 8, 2023    (JP) ................. 2023-129267

(51) Int. Cl.
*H02N 13/00* (2006.01)
*B23Q 3/15* (2006.01)

(52) U.S. Cl.
CPC ............ *H02N 13/00* (2013.01); *B23Q 3/15* (2013.01)

(58) Field of Classification Search
CPC ............ B23Q 3/15; H01L 21/67103; H01L 21/67109; H01L 21/6833; H01L 21/687; H01L 21/68785; H02N 13/00; H05B 3/10; H05B 3/283; H05B 3/74
USPC ........................................... 361/234
See application file for complete search history.

(56) References Cited

U.S. PATENT DOCUMENTS

| | | | |
|---|---|---|---|
| 10,373,854 B2* | 8/2019 | Uefuji | H01L 21/6831 |
| 2005/0258160 A1 | 11/2005 | Goto et al. | |
| 2016/0126125 A1 | 5/2016 | Okugawa et al. | |
| 2017/0309510 A1* | 10/2017 | Maehata | B23Q 3/15 |
| 2018/0286732 A1 | 10/2018 | Uefuji et al. | |
| 2019/0148206 A1* | 5/2019 | Yamaguchi | H01L 21/6833 |
| | | | 219/444.1 |
| 2021/0007183 A1 | 1/2021 | Miwa | |
| 2021/0274599 A1 | 9/2021 | Uematsu et al. | |
| 2023/0380017 A1* | 11/2023 | Takahashi | G01K 1/026 |

FOREIGN PATENT DOCUMENTS

| | | |
|---|---|---|
| JP | 2005-303014 A | 10/2005 |
| JP | 2019-161134 A | 9/2019 |
| JP | 2020-004820 A | 1/2020 |
| JP | 2021-022630 A | 2/2021 |

(Continued)

*Primary Examiner* — Jared Fureman
*Assistant Examiner* — Nicolas Bellido
(74) *Attorney, Agent, or Firm* — Carrier, Shende & Associates P.C.; Joseph P. Carrier; Fulchand P. Shende

(57) ABSTRACT

An electrostatic chuck includes a ceramic dielectric substrate, a base plate, a heater part, and a bypass part. The ceramic dielectric substrate includes a substrate upper surface and a substrate lower surface. The heater part is disposed between the substrate upper surface and the substrate lower surface. The heater part includes at least one heater layer. The heater part includes a heater upper surface and a heater lower surface. The bypass part includes a first bypass portion disposed lower than the substrate lower surface. The first bypass portion including a first bypass upper surface and a first bypass lower surface. A second distance between the heater lower surface and the first bypass upper surface is greater than a first distance between the heater upper surface and the substrate upper surface.

5 Claims, 5 Drawing Sheets

(56) References Cited

FOREIGN PATENT DOCUMENTS

| | | |
|---|---|---|
| KR | 2016-0041758 A | 4/2016 |
| KR | 2017-0138750 A | 12/2017 |
| KR | 2018-0110613 A | 10/2018 |
| KR | 2021-0008522 A | 1/2021 |
| WO | 2019/159862 A1 | 8/2019 |

* cited by examiner

ELECTROSTATIC CHUCK

CROSS-REFERENCE TO RELATED APPLICATIONS

This application is based upon and claims the benefit of priority from Japanese Patent Application No. 2022-154770, filed on Sep. 28, 2022, and No. 2023-129267, filed on Aug. 8, 2023; the entire contents of which are incorporated herein by reference.

FIELD

Embodiments described herein relate generally to an electrostatic chuck.

BACKGROUND

A known electrostatic chuck is configured to have a process object such as a semiconductor wafer, a glass substrate, or the like placed thereon. For example, the electrostatic chuck is used to clamp and hold the process object in a plasma processing chamber of a semiconductor manufacturing apparatus that performs etching, CVD (Chemical Vapor Deposition), sputtering, ion implantation, ashing, etc. For example, the electrostatic chuck applies power for electrostatic clamping to an embedded electrode and clamps a substrate such as a silicon wafer or the like by an electrostatic force.

It is desirable for the electrostatic chuck to control the in-plane temperature distribution of the process object such as the wafer, etc. Therefore, for example, the inclusion of a heater that is subdivided into multiple zones is being investigated. The in-plane temperature distribution of the process object can be controlled by independently adjusting the output of each zone. For example, finer control of the in-plane temperature distribution can be performed by increasing the number of zones. The number of such zones has been increasing in recent years and may be, for example, greater than 100 in some cases.

For example, heat-generating resistors that correspond to the zones are provided, and a conduction part is connected to the heat-generating resistors as a path allowing the flow of current from a power supply to the heat-generating resistors. However, there has been a risk that heat generation by the conduction part may degrade the thermal uniformity of the sample holding surface (JP 2020-004820 A).

However, while fine temperature control may be performed by providing multiple zones in the heater, subdividing the bypass part used as the power supply paths to the zones is likely to reduce the cross-sectional area of the bypass part. When the cross-sectional area of the bypass part is small, the bypass part easily generates heat, and the temperature of the placement surface on which the wafer is placed undesirably deviates from the design value due to the heat from the bypass part.

SUMMARY

According to the embodiment, an electrostatic chuck includes a ceramic dielectric substrate, a base plate, a heater part, and a bypass part. The ceramic dielectric substrate includes a substrate upper surface and a substrate lower surface. A process object is placed on the substrate upper surface. The substrate lower surface is at a side opposite to the substrate upper surface. The base plate is configured to support the ceramic dielectric substrate. The base plate includes a base plate upper surface and a base plate lower surface. The base plate upper surface is at the ceramic dielectric substrate side. The base plate lower surface is at a side opposite to the base plate upper surface. The heater part is disposed between the substrate upper surface and the substrate lower surface. The heater part includes at least one heater layer. The heater part heats the ceramic dielectric substrate. The bypass part is a power supply path to the heater part. The heater part includes a heater upper surface and a heater lower surface. The heater upper surface is an upper surface of a heater layer among the at least one heater layer most proximate to the substrate upper surface. The heater lower surface is a lower surface of a heater layer among the at least one heater layer most proximate to the substrate lower surface. The bypass part includes a first bypass portion. The first bypass portion is disposed lower than the substrate lower surface. The first bypass portion including a first bypass upper surface and a first bypass lower surface. The first bypass upper surface is at the substrate lower surface side. The first bypass lower surface is at a side opposite to the first bypass upper surface. A second distance between the heater lower surface and the first bypass upper surface is greater than a first distance between the heater upper surface and the substrate upper surface.

DETAILED DESCRIPTION

Figure 1:
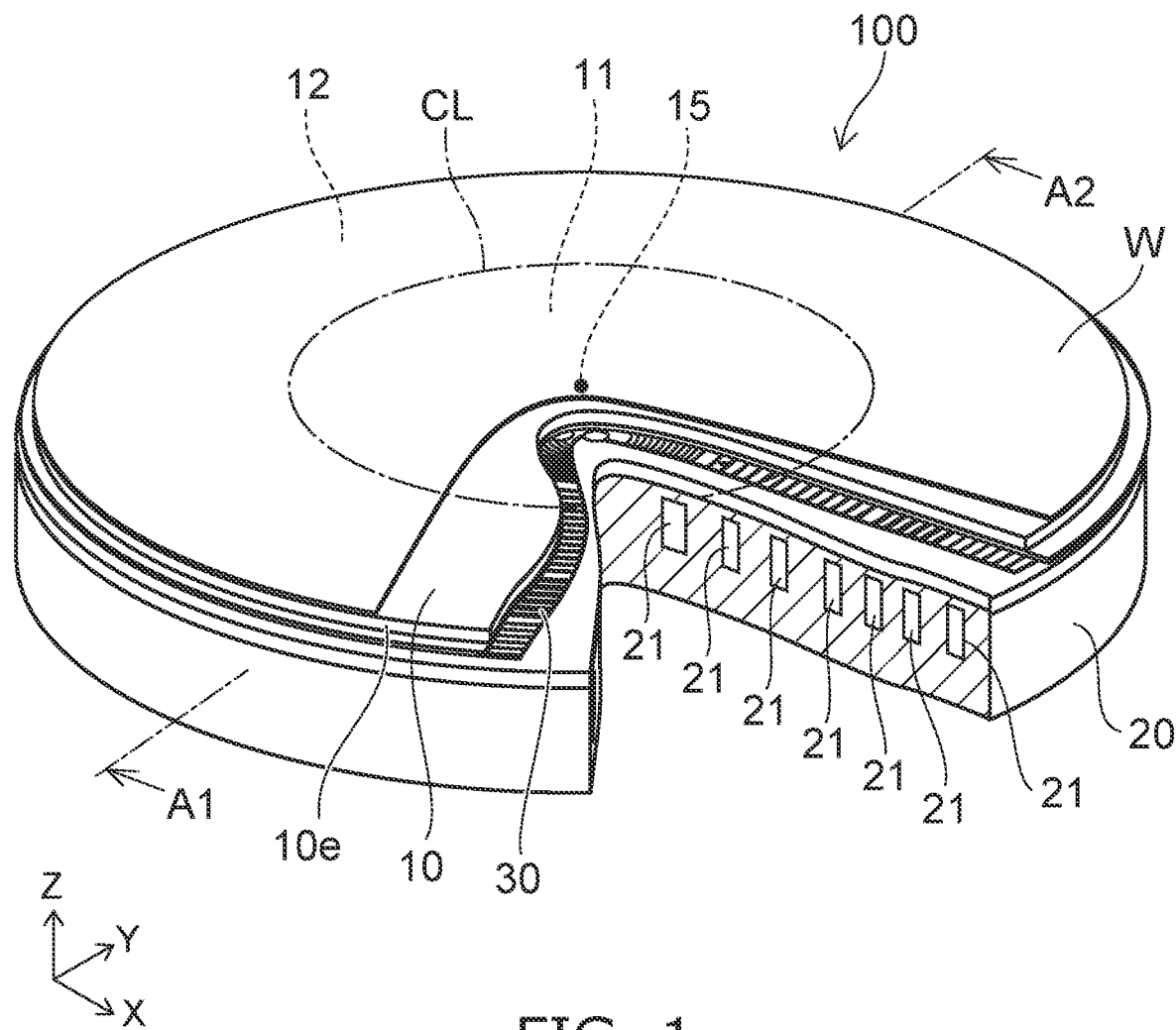
FIG. 1 is a perspective view schematically illustrating an electrostatic chuck according to an embodiment.

A first invention is an electrostatic chuck including: a ceramic dielectric substrate that includes a substrate upper surface on which a process object is placed, and a substrate lower surface at a side opposite to the substrate upper surface; a base plate that supports the ceramic dielectric substrate and includes a base plate upper surface at the ceramic dielectric substrate side, and a base plate lower surface at a side opposite to the base plate upper surface; a heater part that is disposed between the substrate upper surface and the substrate lower surface, includes at least one heater layer, and heats the ceramic dielectric substrate; and a bypass part that is a power supply path to the heater part, wherein the heater part includes a heater upper surface that is an upper surface of a heater layer among the at least one heater layer most proximate to the substrate upper surface, and a heater lower surface that is a lower surface of a heater layer among the at least one heater layer most proximate to the substrate lower surface; the bypass part includes a first bypass portion disposed lower than the substrate lower surface; the first bypass portion includes a first bypass upper surface at the substrate lower surface side, and a first bypass lower surface at a side opposite to the first bypass upper surface; and a second distance between the heater lower surface and the first bypass upper surface is greater than a first distance between the heater upper surface and the substrate upper surface.

According to the electrostatic chuck, the first bypass portion of the bypass part is disposed lower than the substrate lower surface; and the second distance between the heater lower surface and the first bypass upper surface is set to be greater than the first distance between the heater upper surface and the substrate upper surface so that the heater part can be disposed relatively proximate to the placement surface, and the bypass part can be sufficiently distant to the placement surface and the heater part. The effects of the heat from the bypass part on the temperature of the placement surface can be reduced thereby.

A second invention is the electrostatic chuck of the first invention, wherein when viewed along a Z-direction perpendicular to the substrate upper surface, the ceramic dielectric substrate includes a central region positioned at a center of the ceramic dielectric substrate, and an outer circumference region positioned outward of the central region; and the first bypass portion is disposed at a position at which the first bypass portion overlaps the outer circumference region in the Z-direction.

In the electrostatic chuck, the temperature distribution fluctuation in the outer circumference region tends to be greater than the temperature distribution fluctuation in the central region in some cases. According to the electrostatic chuck, the first bypass portion is disposed at a position at which the first bypass portion overlaps the outer circumference region in the Z-direction so that the bypass part can be sufficiently distant to the placement surface and the heater part in the outer circumference region. Large temperature fluctuation of the placement surface in the outer circumference region can be suppressed thereby.

A third invention is the electrostatic chuck of the first or second invention, wherein the bypass part further includes a second bypass portion disposed between the substrate upper surface and the substrate lower surface; the second bypass portion includes a second bypass upper surface at the substrate upper surface side; the second bypass portion includes a second bypass lower surface at a side opposite to the second bypass upper surface; and a third distance between the heater lower surface and the second bypass upper surface is greater than a fourth distance between the second bypass lower surface and the first bypass upper surface.

According to the electrostatic chuck, the design freedom of the bypass part can be increased by providing the second bypass portion between the substrate upper surface and the substrate lower surface. The second bypass portion can be sufficiently distant to the heater part by setting the third distance between the heater lower surface and the second bypass upper surface to be greater than the fourth distance between the second bypass lower surface and the first bypass upper surface. Even when the bypass part includes the second bypass portion, the effects of the heat from the bypass part on the temperature of the placement surface can be reduced thereby.

A fourth invention is the electrostatic chuck of the third invention, wherein when viewed along a Z-direction perpendicular to the substrate upper surface, the ceramic dielectric substrate includes a central region positioned at a center of the ceramic dielectric substrate, and an outer circumference region positioned outward of the central region; and the second bypass portion is disposed in the central region.

In the electrostatic chuck, the temperature distribution fluctuation in the central region tends to be less than the temperature distribution fluctuation in the outer circumference region in some cases. According to the electrostatic chuck, the temperature fluctuation of the placement surface due to the second bypass portion can be suppressed by providing the second bypass portion in the central region. Even when the bypass part includes the second bypass portion, the temperature fluctuation of the placement surface can be suppressed thereby.

A fifth invention is the electrostatic chuck of the third invention, further including a clamping electrode disposed between the substrate upper surface and the heater upper surface, wherein the clamping electrode includes an electrode upper surface at the substrate upper surface side, and an electrode lower surface at a side opposite to the electrode upper surface; and a fifth distance between the electrode lower surface and the heater upper surface is less than the fourth distance.

According to the electrostatic chuck, by setting the fifth distance between the electrode lower surface and the heater upper surface to be less than the fourth distance between the second bypass lower surface and the first bypass upper surface, the heater part can be more proximate to the placement surface; and the bypass part can be more distant to the placement surface. The effects of the heat from the bypass part on the temperature of the placement surface can be reduced thereby.

Embodiments of the invention will now be described with reference to the drawings. Similar components in the drawings are marked with the same reference numerals; and a detailed description is omitted as appropriate.

FIG. 1 is a perspective view schematically illustrating an electrostatic chuck according to an embodiment.

Figure 2:
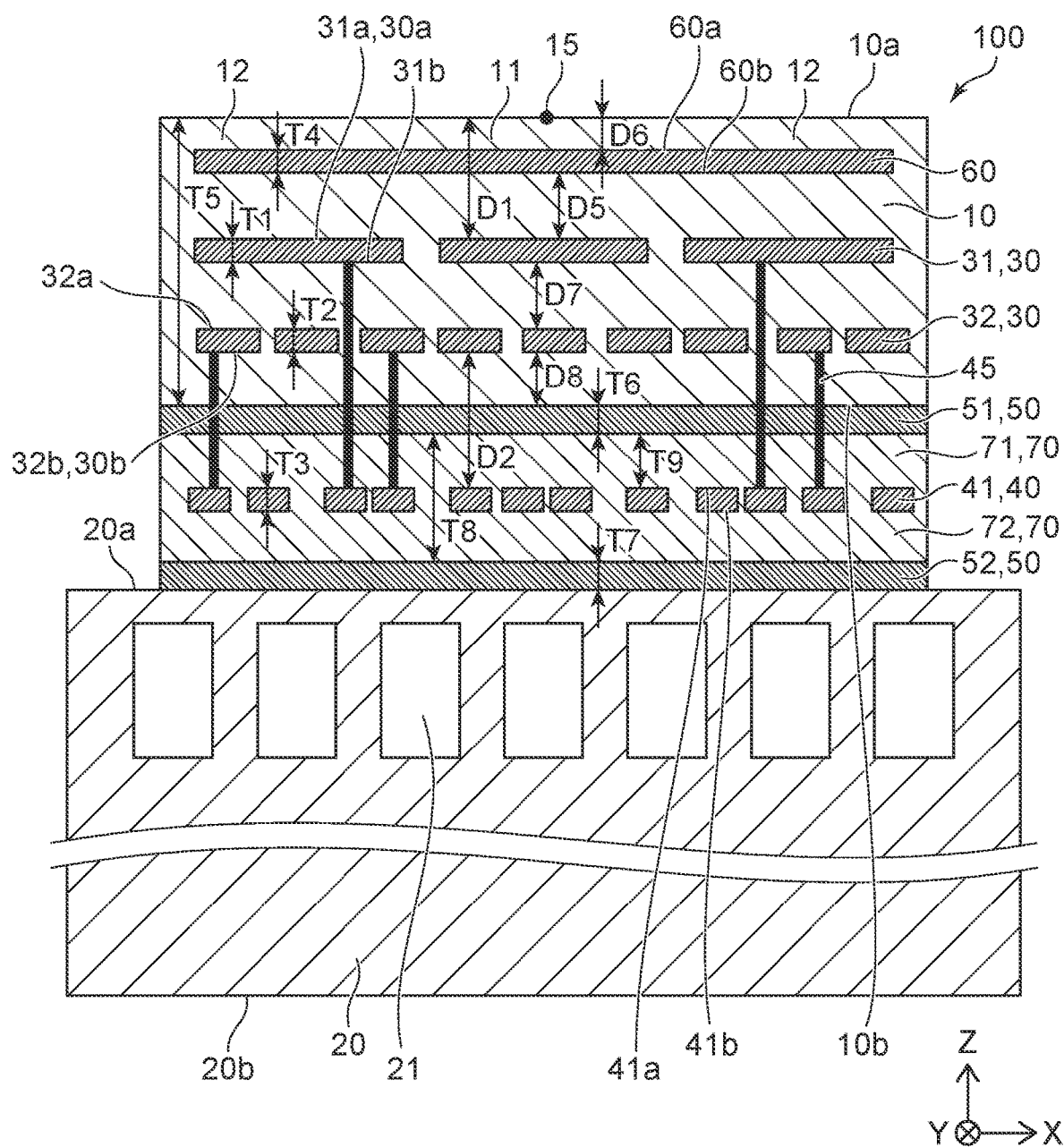
FIG. 2 is a cross-sectional view schematically illustrating the electrostatic chuck according to the embodiment.

FIG. 2 is a cross-sectional view schematically illustrating the electrostatic chuck according to the embodiment.

FIG. 1 is a cross-sectional view of a portion of the electrostatic chuck for convenience of description.

FIG. 2 is a cross-sectional view along line A1-A2 shown in FIG. 1. A process object W is not illustrated in FIG. 2.

As illustrated in FIGS. 1 and 2, the electrostatic chuck 100 according to the embodiment includes a ceramic dielectric substrate 10, a base plate 20, a heater part 30, a bypass part 40, a bonding part 50, and a clamping electrode 60.

The ceramic dielectric substrate 10 is, for example, a flat-plate base material made of a polycrystalline ceramic sintered body. The ceramic dielectric substrate 10 includes a substrate upper surface 10a on which the process object W such as a semiconductor wafer or the like is placed, and a substrate lower surface 10b at the side opposite to the substrate upper surface 10a. The substrate upper surface 10a corresponds to the placement surface.

In this specification, the direction perpendicular to the substrate upper surface 10a is taken as a Z-direction. In other words, the Z-direction is the direction connecting the substrate upper surface 10a and the substrate lower surface 10b. In other words, the Z-direction is the direction from the base plate 20 toward the ceramic dielectric substrate 10. One direction orthogonal to the Z-direction is taken as an X-direction; and a direction orthogonal to the Z-direction and the X-direction is taken as a Y-direction. In this specification, "in the plane" is, for example, in the X-Y plane. In this specification, "when viewed in plan" indicates a state viewed along the Z-direction.

Examples of the material of the crystal included in the ceramic dielectric substrate 10 include, for example, $Al_2O_3$, AlN, SiC, $Y_2O_3$, YAG, etc. By using such a material, the infrared transmissivity, thermal conductivity, insulation resistance, and plasma resistance of the ceramic dielectric substrate 10 can be increased.

The clamping electrode 60 is disposed inside the ceramic dielectric substrate 10. The clamping electrode 60 is interposed between the substrate upper surface 10a and the substrate lower surface 10b. In other words, the clamping electrode 60 is disposed inside the ceramic dielectric substrate 10. The clamping electrode 60 is sintered to have a continuous body with the ceramic dielectric substrate 10. The clamping electrode 60 includes an electrode upper surface 60a at the substrate upper surface 10a side, and an electrode lower surface 60b at the side opposite to the electrode upper surface 60a.

The electrostatic chuck 100 clamps and holds the process object W by an electrostatic force by applying a clamping voltage to the clamping electrode 60 to generate a charge at the substrate upper surface 10a side of the clamping electrode 60.

The clamping electrode 60 extends along the substrate upper surface 10a and the substrate lower surface 10b. The clamping electrode 60 may be monopolar or bipolar. The clamping electrode 60 may be tripolar or another multi-pole type. The number of the clamping electrodes 60 and the arrangement of the clamping electrodes 60 are appropriately selected. The clamping electrode 60 is disposed between the substrate upper surface 10a and the heater part 30 described below. The necessary clamping force can be realized thereby.

The base plate 20 is disposed at the substrate lower surface 10b side of the ceramic dielectric substrate 10 and supports the ceramic dielectric substrate 10. The base plate 20 includes a base plate upper surface 20a at the ceramic dielectric substrate 10 side, and a base plate lower surface 20b at the side opposite to the base plate upper surface 20a. A coolant flow path 21 that allows a cooling medium to flow is provided in the base plate 20. That is, the coolant flow path 21 is provided inside the base plate 20. Examples of the material of the base plate 20 include, for example, aluminum, aluminum alloys, titanium, and titanium alloys.

The base plate 20 performs the role of temperature adjustment of the ceramic dielectric substrate 10. For example, when cooling the ceramic dielectric substrate 10, the cooling medium is caused to flow into the coolant flow path 21, pass through the coolant flow path 21, and flow out from the coolant flow path 21. As a result, the heat of the base plate 20 can be absorbed by the cooling medium; and the ceramic dielectric substrate 10 that is mounted on the base plate 20 can be cooled.

The heater part 30 heats the ceramic dielectric substrate 10. By heating the ceramic dielectric substrate 10, the heater part 30 heats the process object W via the ceramic dielectric substrate 10. The heater part 30 is disposed between the substrate upper surface 10a and the substrate lower surface 10b. In other words, the heater part 30 is disposed inside the ceramic dielectric substrate 10. In other words, the heater part 30 is embedded in the ceramic dielectric substrate 10. By providing the heater part 30 proximate to the placement surface, the temperature controllability of the placement surface can be increased.

The heater part 30 includes at least one heater layer. In the example, the heater part 30 includes a first heater layer 31 and a second heater layer 32. One of the first heater layer 31 or the second heater layer 32 may be omitted. The heater part 30 may further include another heater layer in addition to the first heater layer 31 and the second heater layer 32.

For example, the second heater layer 32 generates a lower heat amount than the first heater layer 31. In other words, the first heater layer 31 is a high-output main heater; and the second heater layer 32 is a low-output sub-heater.

Thus, because the second heater layer 32 generates a lower heat amount than the first heater layer 31, the in-plane temperature unevenness of the process object W caused by the pattern of the first heater layer 31 can be finely adjusted by the second heater layer 32. Accordingly, the in-plane temperature distribution uniformity of the process object W can be increased.

Examples of the materials of the first heater layer 31 and the second heater layer 32 include, for example, metals including at least one of titanium, chrome, nickel, copper, aluminum, molybdenum, tungsten, palladium, platinum, silver, tantalum, molybdenum carbide, or tungsten carbide. It is favorable for the materials of the first heater layer 31 and the second heater layer 32 to include a ceramic material and such metals. Examples of the ceramic material include aluminum oxide ($Al_2O_3$), yttrium oxide ($Y_2O_3$), yttrium aluminum garnet (YAG ($Y_3Al_5O_{12}$)), aluminum nitride (AlN), silicon carbide (SiC), etc. It is favorable for the ceramic material included in the first heater layer 31 and the second heater layer 32 to be the same as the component of the ceramic dielectric substrate 10.

The first heater layer 31 and the second heater layer 32 each generate heat when a current flows. The first heater layer 31 and the second heater layer 32 heat the ceramic dielectric substrate 10 by emitting heat. For example, the first heater layer 31 and the second heater layer 32 make the in-plane temperature distribution of the process object W uniform by heating the process object W via the ceramic dielectric substrate 10. Or, for example, the first heater layer 31 and the second heater layer 32 may intentionally cause a difference in the in-plane temperature of the process object W by heating the process object W via the ceramic dielectric substrate 10.

The first heater layer 31 includes a first heater upper surface 31a at the substrate upper surface 10a side, and a first heater lower surface 31b at the side opposite to the first heater upper surface 31a. The second heater layer 32 includes a second heater upper surface 32a at the substrate upper surface 10a side, and a second heater lower surface 32b at the side opposite to the second heater upper surface 32a.

In the example, the first heater layer 31 is disposed on the second heater layer 32 inside the ceramic dielectric substrate 10. That is, in the example, the first heater upper surface 31a and the first heater lower surface 31b are positioned between the substrate upper surface 10a and the second heater upper surface 32a. The second heater upper surface 32a and the second heater lower surface 32b are positioned between the first heater lower surface 31b and the substrate lower surface 10b. The first heater layer 31 may be disposed below the second heater layer 32.

The heater part 30 includes a heater upper surface 30a and a heater lower surface 30b. The heater upper surface 30a is the upper surface of the heater layer most proximate to the substrate upper surface 10a. The heater lower surface 30b is the lower surface of the heater layer most proximate to the substrate lower surface 10b. In the example, the heater layer most proximate to the substrate upper surface 10a is the first heater layer 31. Therefore, in the example, the heater upper surface 30a is the first heater upper surface 31a. In the example, the heater layer most proximate to the substrate lower surface 10b is the second heater layer 32. Therefore, in the example, the heater lower surface 30b is the second heater lower surface 32b.

For example, when the second heater layer 32 is not provided, the heater layer most proximate to the substrate upper surface 10a and the heater layer most proximate to the substrate lower surface 10b both are the first heater layer 31. Therefore, in such a case, the heater upper surface 30a is the first heater upper surface 31a; and the heater lower surface 30b is the first heater lower surface 31b. Similarly, for example, when the first heater layer 31 is not disposed, the heater layer most proximate to the substrate upper surface 10a and the heater layer most proximate to the substrate lower surface 10b both are the second heater layer 32. Therefore, in such a case, the heater upper surface 30a is the second heater upper surface 32a; and the heater lower surface 30b is the second heater lower surface 32b.

In the example, the clamping electrode 60 is disposed above the heater part 30 inside the ceramic dielectric substrate 10. That is, in the example, the clamping electrode 60 is disposed between the substrate upper surface 10a and the heater upper surface 30a.

The bypass part 40 is a power supply path to the heater part 30. The bypass part 40 is electrically connected with the heater part 30, specifically the first heater layer 31 and the second heater layer 32, via a connection part 45.

The bypass part 40 is electrically-conductive. When the bypass part 40 is provided inside the ceramic dielectric substrate 10, the material of the portion of the bypass part 40 disposed inside the ceramic dielectric substrate 10 (i.e., a second bypass portion 42 described below) is, for example, the same as the material of the first heater layer 31 and the second heater layer 32. When the bypass part 40 is disposed outside the ceramic dielectric substrate 10, the material of the portion of the bypass part 40 disposed outside the ceramic dielectric substrate 10 (i.e., a first bypass portion 41 described below) is, for example, different from the material of the first heater layer 31 and the second heater layer 32. In such a case, examples of the material of the bypass part 40 include, for example, metals including at least one of stainless steel, titanium, chrome, nickel, copper, aluminum, Inconel (registered trademark), molybdenum, tungsten, palladium, platinum, silver, tantalum, molybdenum carbide, or tungsten carbide.

For example, the bypass part 40 is covered with an insulating layer 70. The insulating layer 70 includes, for example, a first insulating part 71 positioned at the placement surface side of the bypass part 40, and a second insulating part 72 positioned at the side opposite to the bypass part 40.

Power from the outside is supplied to the bypass part 40 via a power supply terminal (not illustrated). The power that is supplied from the outside is supplied to the heater part 30 (the first heater layer 31 and the second heater layer 32) via the bypass part 40 and the connection part 45.

The bypass part 40 includes multiple regions. The bypass part 40 includes, for example, a region connected with the first heater layer 31, and a region connected with the second heater layer 32. The region connected with the first heater layer 31 and the region connected with the second heater layer 32 may be arranged in the same plane or may be disposed in different planes.

For example, the voltage and current provided to the region connected with the first heater layer 31 are different from the voltage and current provided to the region connected with the second heater layer 32. As a result, the output of the first heater layer 31 can be different from the output of the second heater layer 32. For example, the first heater layer 31 and the second heater layer 32 are separately controlled thereby.

The first heater layer 31 includes, for example, multiple first zones arranged in the same plane. The bypass part 40 includes, for example, a region of the bypass part 40 connected with one zone among the multiple first zones of the first heater layer 31, and a region of the bypass part 40 connected with one other zone among the multiple first zones. The region connected with the one zone among the multiple first zones of the first heater layer 31 and the region connected with the one other zone among the multiple first zones may be arranged in the same plane or may be disposed in different planes.

The voltage and current provided to the region connected with the one zone among the multiple first zones are, for example, different from the voltage and current provided to the region connected with the one other zone among the multiple first zones. As a result, the output of the one zone among the multiple first zones can be different from the output of the one other zone among the multiple first zones. For example, the multiple first zones included in the first heater layer 31 are separately controlled thereby.

Similarly, the second heater layer 32 includes, for example, multiple second zones arranged in the same plane. The bypass part 40 includes, for example, a region of the bypass part 40 connected with one zone among the multiple second zones of the second heater layer 32, and a region of the bypass part 40 connected with one other zone among the multiple second zones.

The region of the bypass part 40 connected with the one zone among the multiple second zones of the second heater layer 32 and the region of the bypass part 40 connected with the one other zone among the multiple second zones may be arranged in the same plane or may be disposed in different planes.

The voltage and current provided to the region connected with the one zone among the multiple second zones are, for example, different from the voltage and current provided to the region connected with the one other zone among the multiple second zones. As a result, the output of the one zone among the multiple second zones can be different from the output of the one other zone among the multiple second zones. For example, the multiple second zones included in the second heater layer 32 are separately controlled thereby.

The bypass part 40 may be disposed between the heater part 30 and the base plate upper surface 20a. The bypass part 40 may be disposed below the base plate lower surface 20b. The bypass part 40 includes the first bypass portion 41. The first bypass portion 41 is disposed lower than the substrate lower surface 10b. That is, the first bypass portion 41 is disposed outside the ceramic dielectric substrate 10. In the example, the first bypass portion 41 is disposed between the substrate lower surface 10b and the base plate upper surface 20a. The first bypass portion 41 is disposed between the ceramic dielectric substrate 10 and the base plate 20. The first bypass portion 41 includes a first bypass upper surface 41a at the substrate lower surface 10b side, and a first bypass lower surface 41b at the side opposite to the first bypass upper surface 41a.

In the example, a portion of the first bypass portion 41 is connected with the first heater layer 31 via the connection part 45. In the example, another portion of the first bypass portion 41 is connected with the second heater layer 32 via the connection part 45.

When the first bypass portion 41 is disposed between the ceramic dielectric substrate 10 and the base plate 20, the bonding part 50 is disposed between the ceramic dielectric substrate 10 and the base plate 20 and bonds the ceramic dielectric substrate 10 and the base plate 20. In the example shown in FIG. 2, the bonding part 50 includes a first bonding portion 51 and a second bonding portion 52. For example, the first bonding portion 51 contacts the substrate lower surface 10b and the first insulating part 71. The second bonding portion 52 contacts the base plate upper surface 20a and the second insulating part 72. When the first bypass part 41 is disposed below the base plate 20 (not illustrated), the bonding part 50 includes the first bonding portion 51; and the first bonding portion 51 contacts the base plate lower surface 20b and the first insulating part 71. One of the first bonding portion 51 or the second bonding portion 52 may be omitted.

For example, an insulating material such as a resin, etc., can be used as the materials of the first and second bonding portions 51 and 52. Examples of the materials of the first and second bonding portions 51 and 52 include, for example, a silicone resin, etc.

For example, an insulating material such as a resin, a ceramic, etc., can be used as the material of the insulating layer 70. Polyimide, polyamideimide, etc., are examples when the insulating layer 70 is a resin.

Figure 3:
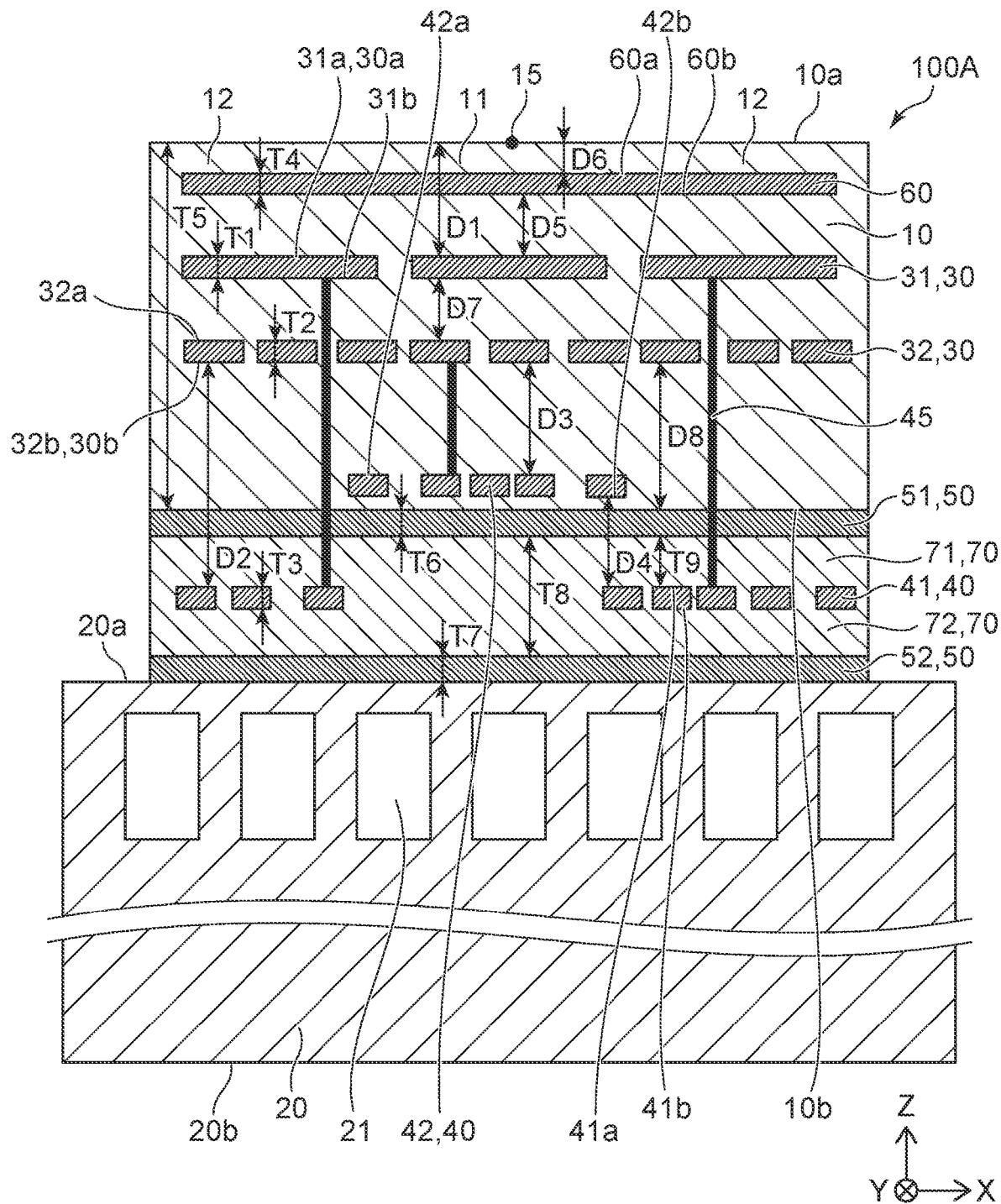
FIG. 3 is a cross-sectional view schematically illustrating an electrostatic chuck according to a first modification of the embodiment.

According to the embodiment, a second distance D2 between the heater lower surface 30b and the first bypass upper surface 41a is greater than a first distance D1 between the heater upper surface 30a and the substrate upper surface 10a. The first distance D1 is, for example, not less than 0.4 mm and not more than 1.5 mm, and favorably not less than 0.5 mm and not more than 1.0 mm. When the first bypass portion 41 is disposed between the ceramic dielectric substrate 10 and the base plate 20 as shown in FIGS. 2 and 3, the second distance D2 is, for example, not less than 0.25 mm and not more than 4.1 mm. When the first bypass portion 41 is disposed below the base plate 20, the second distance D2 is substantially the thickness of the base plate 20 added to the numerical ranges described above (the details are described below). In such an embodiment, the first bypass portion 41 can be sufficiently separated from the heater part 30.

A fifth distance D5 between the electrode lower surface 60b and the heater upper surface 30a is, for example, not less than 0.3 mm and not more than 1.0 mm. If the fifth distance D5 is not less than 0.3 mm, short-circuits between the clamping electrode 60 and the heater part 30 can be suppressed. If the fifth distance D5 is not more than 1.0 mm, the process object W can be rapidly heated, and the surface temperature controllability can be improved. Also, the heat necessary for heating can be reduced.

A sixth distance D6 between the substrate upper surface 10a and the electrode upper surface 60a is, for example, not less than 0.1 mm and not more than 0.5 mm. If the sixth distance D6 is not less than 0.1 mm, dielectric breakdown of the portion of the ceramic dielectric substrate 10 between the substrate upper surface 10a and the electrode upper surface 60a can be suppressed. If the sixth distance D6 is not more than 0.5 mm, a reduction of the clamping force can be suppressed.

A seventh distance D7 between the first heater lower surface 31b and the second heater upper surface 32a is, for example, not less than 0.3 mm and not more than 1.0 mm. If the seventh distance D7 is not less than 0.3 mm, short-circuits between the first heater layer 31 and the second heater layer 32 can be suppressed. If the seventh distance D7 is not more than 1.0 mm, the second heater layer 32 can be sufficiently proximate to the process object W; and surface temperature controllability can be improved.

An eighth distance D8 between the second heater lower surface 32b and the substrate lower surface 10b, while arbitrary, may be not less than 0.1 mm and not more than 3 mm as an example.

A ninth thickness T9 (the Z-direction length) of the first insulating part 71 is, for example, not less than 0.025 mm and not more than 0.1 mm. If the ninth thickness T9 is not less than 0.025 mm, the effects of the heat generation from the first bypass portion 41 can be more effectively suppressed, and short-circuit of the first bypass portion 41 can be suppressed.

A first thickness T1 (the Z-direction length) of the first heater layer 31 is, for example, not less than 0.01 mm and not more than 0.20 mm. A second thickness T2 (the Z-direction length) of the second heater layer 32 is, for example, not less than 0.01 mm and not more than 0.20 mm. A third thickness T3 (the Z-direction length) of the first bypass portion 41 is, for example, not less than 0.03 mm and not more than 0.30 mm. A fourth thickness T4 (the Z-direction length) of the clamping electrode 60 is, for example, not less than 0.001 mm and not more than 0.1 mm. A fifth thickness T5 (the Z-direction length) of the ceramic dielectric substrate 10 is, for example, not less than 2.0 mm and not more than 5.0 mm, and favorably not less than 2.5 mm and not more than 4.0 mm. A sixth thickness T6 (the Z-direction length) of the first bonding portion 51 is, for example, not less than 0.1 mm and not more than 1 mm. A seventh thickness T7 (the Z-direction length) of the second bonding portion 52 is, for example, not less than 0.1 mm and not more than 1 mm. An eighth thickness T8 (the Z-direction length) of the insulating layer 70 is, for example, not less than 0.08 mm and not more than 0.5 mm.

The first distance D1 is the sum of the sixth distance D6, the fifth distance D5, and the fourth thickness T4 (D1=D6+D5+T4). The first distance D1 can be adjusted by adjusting one of the sixth distance D6, the fifth distance D5, or the fourth thickness T4.

As an example when the first bypass portion 41 is disposed between the ceramic dielectric substrate 10 and the base plate 20, the second distance D2 is the sum of the eighth distance D8, the ninth thickness T9, and the sixth thickness T6 (D2=D8+T9+T6). The second distance D2 can be adjusted by adjusting one of the eighth distance D8, the ninth thickness T9, or the sixth thickness T6. When the first bypass portion 41 is disposed below the base plate 20, the second distance D2 is the sum of the eighth distance D8, the ninth thickness T9, the sixth thickness T6, the seventh thickness T7, and the thickness of the base plate.

Thus, by positioning the first bypass portion 41 of the bypass part 40 lower than the substrate lower surface 10b and by setting the second distance D2 between the heater lower surface 30b and the first bypass upper surface 41a to be greater than the first distance D1 between the heater upper surface 30a and the substrate upper surface 10a, the heater part 30 can be disposed relatively proximate to the placement surface; and the bypass part 40 can be sufficiently distant to the placement surface and the heater part 30. The effects of the heat from the bypass part 40 on the temperature of the placement surface can be reduced thereby.

Although not illustrated in FIGS. 2 and 3, there are cases where multiple dots on which the process object W is placed and a sealing ring disposed at the outer circumference edge of the ceramic dielectric substrate 10 are provided in the substrate upper surface 10a of the ceramic dielectric substrate 10. Also, there are cases where an inner seal that subdivides the placement surface into multiple zones is provided at the inner side of the sealing ring. There are cases where grooves are provided in the substrate upper surface 10a to supply a cooling gas for cooling the back side of the process object W in the state in which the process object W is placed on the dots, the sealing ring, and the inner seal.

In the specification, the "substrate upper surface 10a" that is used as the distance calculation starting point of the first distance D1 ("between the heater upper surface 30a and the substrate upper surface 10a") and the sixth distance D6 ("between the substrate upper surface 10a and the electrode upper surface 60a") refers to the portion on which the process object W is placed. Specifically, when dots and/or seals (the sealing ring and the inner seal) are provided, the "substrate upper surface 10a" is the top surface of the dots and/or seals. When the heights of the multiple dots and/or seals change in the placement surface, the "substrate upper surface 10a" is taken to be the highest portion.

The ceramic dielectric substrate 10 includes a central region 11 and an outer circumference region 12. When viewed along the Z-direction, the central region 11 is positioned at the center of the ceramic dielectric substrate 10. When viewed along the Z-direction, the outer circumference region 12 is positioned outward of the central region 11 and includes the outer circumference edge of the ceramic dielectric substrate 10. In the electrostatic chuck, the fluctuation of the temperature distribution of the outer circumference region 12 tends to be greater than the fluctuation of the temperature distribution of the central region 11 in some cases.

The central region 11 includes, for example, a center 15 of the ceramic dielectric substrate 10. The central region 11 is the region inward of a center line CL between the center 15 and an outer circumference edge 10e of the ceramic dielectric substrate 10. That is, the central region 11 is surrounded with the center line CL. The outer circumference region 12 is the region further outward of the center line CL. That is, the outer circumference region 12 is between the center line CL and the outer circumference edge 10e.

For example, the first bypass portion 41 is disposed at a position at which the first bypass portion 41 overlaps the outer circumference region 12 in the Z-direction. By providing the first bypass portion 41 at a position at which the first bypass portion 41 overlaps the outer circumference region 12 in the Z-direction, the bypass part 40 in the outer circumference region 12 can be sufficiently distant to the placement surface and the heater part 30. Large temperature fluctuation of the placement surface in the outer circumference region 12 can be suppressed thereby.

When a step is provided in the outer circumference portion of the ceramic dielectric substrate 10, "the outer circumference edge of the ceramic substrate" in the specification refers to the vicinity of the portion at which the clamping electrode 60 is disposed (the outer circumference edge of the upper level).

FIG. 3 is a cross-sectional view schematically illustrating an electrostatic chuck according to a first modification of the embodiment.

FIG. 3 is a cross-sectional view along line A1-A2 shown in FIG. 1. The process object W is not illustrated in FIG. 3.

As illustrated in FIG. 3, other than the second bypass portion 42 being included, the electrostatic chuck 100A according to the first modification of the embodiment is substantially the same as the electrostatic chuck 100 described above.

In the example, the bypass part 40 further includes the second bypass portion 42 in addition to the first bypass portion 41. The second bypass portion 42 is disposed between the substrate upper surface 10a and the substrate lower surface 10b. That is, the second bypass portion 42 is disposed inside the ceramic dielectric substrate 10. More specifically, the second bypass portion 42 is disposed between the heater lower surface 30b and the substrate lower surface 10b. The second bypass portion 42 includes a second bypass upper surface 42a at the substrate upper surface 10a (heater lower surface 30b) side, and a second bypass lower surface 42b at the side opposite to the second bypass upper surface 42a.

In the example, the first bypass portion 41 is connected with the first heater layer 31 via the connection part 45. That is, the first bypass portion 41 corresponds to the region of the bypass part 40 connected with the first heater layer 31. In the example, the second bypass portion 42 is connected with the second heater layer 32 via the connection part 45. That is, the second bypass portion 42 corresponds to the region of the bypass part 40 connected with the second heater layer 32.

In the example, the second bypass portion 42 overlaps the first bypass portion 41 in the Z-direction. The second bypass portion 42 may overlap the first bypass portion 41 or may not overlap the first bypass portion 41 in the Z-direction.

In the example as well, the second distance D2 between the heater lower surface 30b and the first bypass upper surface 41a is greater than the first distance D1 between the heater upper surface 30a and the substrate upper surface 10a. As a result, the heater part 30 can be disposed relatively proximate to the placement surface; the bypass part 40 can be sufficiently distant to the placement surface and the heater part 30; and the effects of the heat from the bypass part 40 on the temperature of the placement surface can be reduced.

In the example, a third distance D3 between the heater lower surface 30b and the second bypass upper surface 42a is greater than a fourth distance D4 between the second bypass lower surface 42b and the first bypass upper surface 41a.

Thus, the design freedom of the bypass part 40 can be increased by providing the second bypass portion 42 between the substrate upper surface 10a and the substrate lower surface 10b. Also, the second bypass portion 42 can be sufficiently distant to the heater part 30 by setting the third distance D3 between the heater lower surface 30b and the second bypass upper surface 42a to be greater than the fourth distance D4 between the second bypass lower surface 42b and the first bypass upper surface 41a. As a result, the effects of the heat from the bypass part 40 on the temperature of the placement surface can be reduced even when the bypass part 40 includes the second bypass portion 42.

In the example, the clamping electrode 60 is disposed between the substrate upper surface 10a and the heater upper surface 30a. The fifth distance D5 between the electrode lower surface 60b and the heater upper surface 30a is less than the fourth distance D4 between the second bypass lower surface 42b and the first bypass upper surface 41a.

Thus, by setting the fifth distance D5 between the electrode lower surface 60b and the heater upper surface 30a to be less than the fourth distance D4 between the second bypass lower surface 42b and the first bypass upper surface 41a, the heater part 30 can be more proximate to the placement surface; and the bypass part 40 can be more distant to the placement surface. The effects of the heat from the bypass part 40 on the temperature of the placement surface can be reduced thereby.

The ceramic dielectric substrate 10 includes the central region 11 and the outer circumference region 12. The central region 11 and the outer circumference region 12 are the same as the central region 11 and the outer circumference region 12 of FIGS. 1 and 2 above. In the electrostatic chuck, the fluctuation of the temperature distribution of the central region 11 tends to be less than the fluctuation of the temperature distribution of the outer circumference region 12 in some cases.

For example, the second bypass portion 42 is disposed in the central region 11. By providing the second bypass portion 42 in the central region 11, the temperature fluctuation of the placement surface due to the second bypass portion 42 being included can be suppressed. As a result, the temperature fluctuation of the placement surface can be suppressed even when the bypass part 40 includes the second bypass portion 42.

Figure 4:
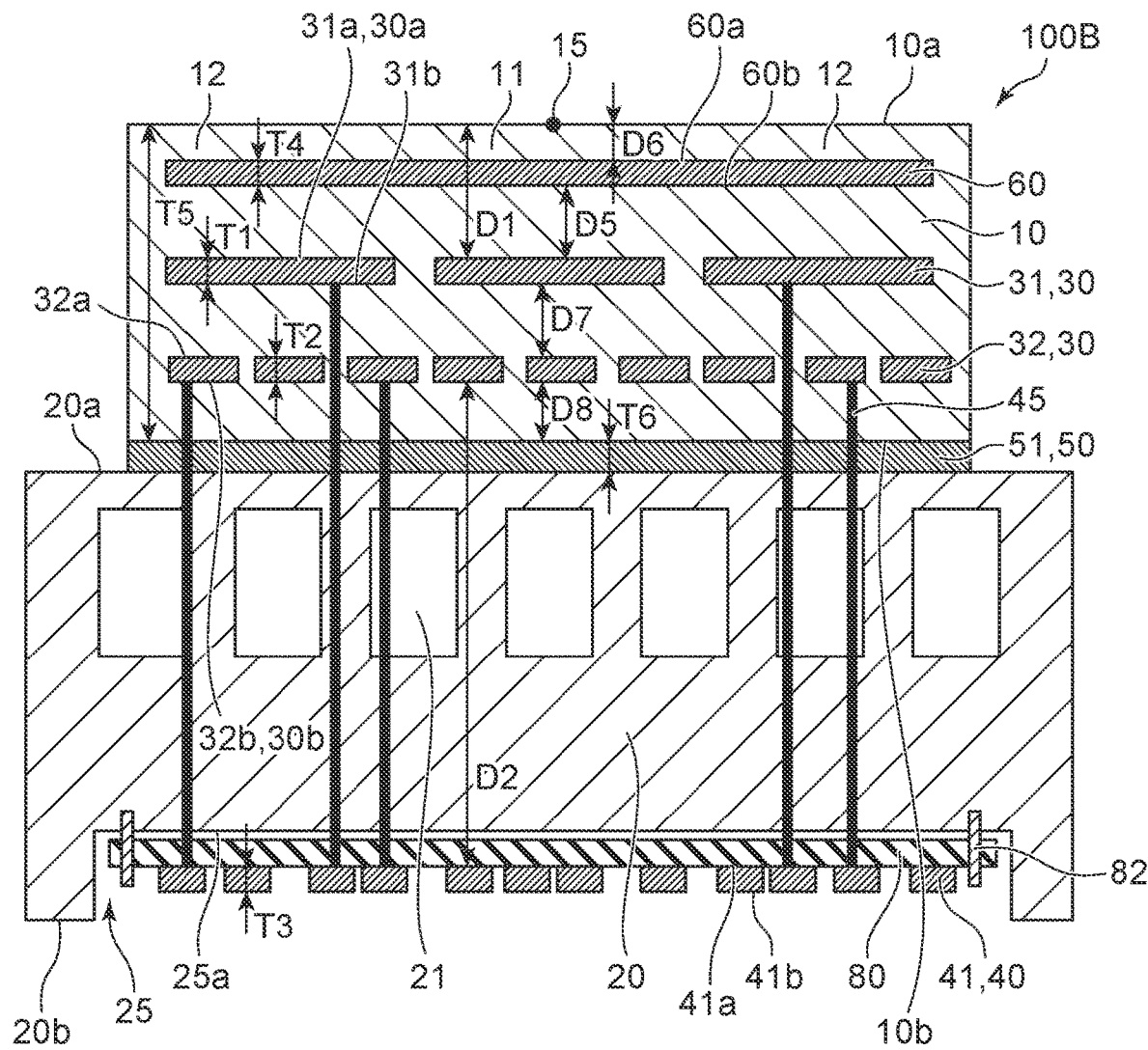
FIG. 4 is a cross-sectional view schematically illustrating an electrostatic chuck according to a second modification of the embodiment.

FIG. 4 is a cross-sectional view schematically illustrating an electrostatic chuck according to a second modification of the embodiment.

FIG. 4 is a cross-sectional view along line A1-A2 shown in FIG. 1. The process object W is not illustrated in FIG. 4.

As illustrated in FIG. 4, other than the bypass part 40 (the first bypass portion 41) being disposed under the base plate 20, and other than the insulating layer 70 and the second bonding portion 52 being omitted, the electrostatic chuck 100B according to the second modification of the embodiment is substantially the same as the electrostatic chuck 100 described above.

In the example, a recess 25 that is recessed upward is provided in the lower portion of the base plate 20. The bypass part 40 (the first bypass portion 41) is disposed inside the recess 25. More specifically, the bypass part 40 (the first bypass portion 41) is disposed at the lower surface of an insulating substrate 80. The insulating substrate 80 is fixed to a bottom surface 25a of the recess 25 by a fastening member 82. The insulating substrate 80 includes, for example, an insulating material such as a resin, etc. The fastening member 82 is, for example, a bolt, etc.

By providing the bypass part 40 (the first bypass portion 41) under the base plate 20, the bypass part 40 can be sufficiently distant to the placement surface; and the effects of the heat from the bypass part 40 on the temperature of the placement surface can be reduced. Accordingly, the effects of the heat from the bypass part 40 on the thermal uniformity of the placement surface can be reduced.

In the example as well, the second distance D2 between the heater lower surface 30b and the first bypass upper surface 41a is greater than the first distance D1 between the heater upper surface 30a and the substrate upper surface 10a. As a result, the heater part 30 can be disposed relatively proximate to the placement surface; the bypass part 40 can be sufficiently distant to the placement surface and the heater part 30; and the effects of the heat from the bypass part 40 on the temperature of the placement surface can be reduced.

When the second bypass portion 42 also is included, the second bypass portion 42 is disposed inside the ceramic dielectric substrate 10; and the first bypass portion 41 is disposed under the base plate 20.

Figure 5:
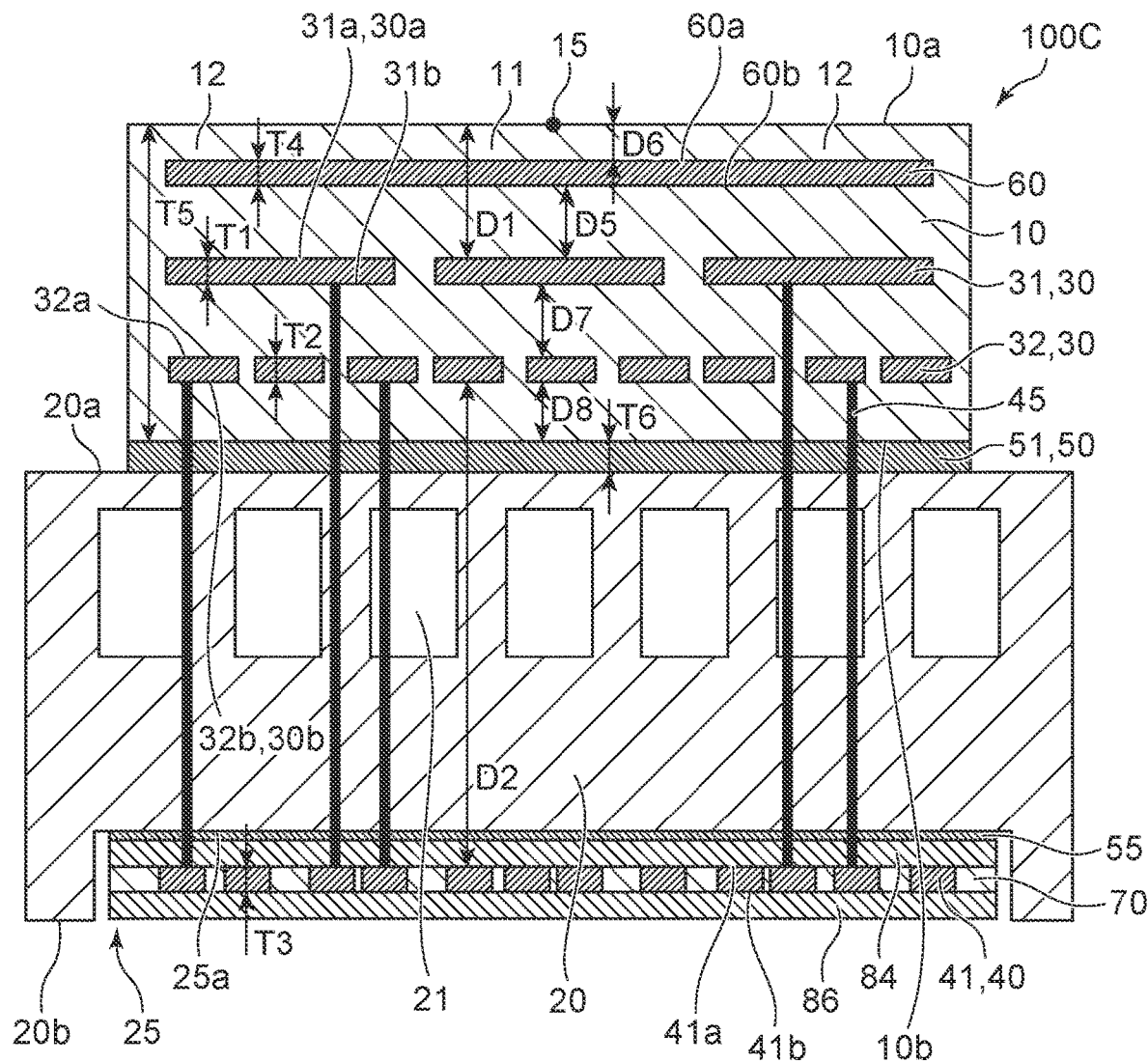
FIG. 5 is a cross-sectional view schematically illustrating an electrostatic chuck according to a third modification of the embodiment.

FIG. 5 is a cross-sectional view schematically illustrating an electrostatic chuck according to a third modification of the embodiment.

FIG. 5 is a cross-sectional view along line A1-A2 shown in FIG. 1. The process object W is not illustrated in FIG. 5.

As illustrated in FIG. 5, other than the bypass part 40 (the first bypass portion 41) being disposed inside the recess 25 of the base plate 20 with a bonding part 55 interposed, and other than the bypass part 40 (the first bypass portion 41) being sandwiched between a first metal plate 84 and a second metal plate 86, the electrostatic chuck 100C according to the third modification of the embodiment is substantially the same as the electrostatic chuck 100B described above.

In the example, the bypass part 40 (the first bypass portion 41) is disposed between the first metal plate 84 and the second metal plate 86. The bypass part 40 (the first bypass portion 41) is surrounded with the insulating layer 70. The first metal plate 84 is fixed to the bottom surface 25a of the recess 25 via the bonding part 55 inside the recess 25. The bonding part 55 is disposed between the first metal plate 84 and the base plate 20 and bonds the first metal plate 84 and the base plate 20. The first metal plate 84 and the second metal plate 86 include, for example, a metal such as aluminum, etc. For example, the examples of the materials of the first and second bonding portions 51 and 52 can be used as the material of the bonding part 55.

In the example as well, by providing the bypass part 40 (the first bypass portion 41) under the base plate 20, the bypass part 40 can be sufficiently distant to the placement surface; and the effects of the heat from the bypass part 40 on the temperature of the placement surface can be reduced. Accordingly, the effects of the heat from the bypass part 40 on the thermal uniformity of the placement surface can be reduced.

In the example as well, the second distance D2 between the heater lower surface 30b and the first bypass upper surface 41a is greater than the first distance D1 between the heater upper surface 30a and the substrate upper surface 10a. As a result, the heater part 30 can be disposed relatively proximate to the placement surface; the bypass part 40 can be sufficiently distant to the placement surface and the heater part 30; and the effects of the heat from the bypass part 40 on the temperature of the placement surface can be reduced.

Embodiments may include the following configurations.
Configuration 1
  An electrostatic chuck, comprising:
  a ceramic dielectric substrate including
    a substrate upper surface on which a process object is placed, and
    a substrate lower surface at a side opposite to the substrate upper surface;
  a base plate configured to support the ceramic dielectric substrate, the base plate including
    a base plate upper surface at the ceramic dielectric substrate side, and
    a base plate lower surface at a side opposite to the base plate upper surface;
  a heater part disposed between the substrate upper surface and the substrate lower surface, the heater part including at least one heater layer, the heater part heating the ceramic dielectric substrate; and
  a bypass part that is a power supply path to the heater part, the heater part including
    a heater upper surface that is an upper surface of a heater layer among the at least one heater layer most proximate to the substrate upper surface, and
    a heater lower surface that is a lower surface of a heater layer among the at least one heater layer most proximate to the substrate lower surface,
  the bypass part including a first bypass portion disposed lower than the substrate lower surface,
  the first bypass portion including
    a first bypass upper surface at the substrate lower surface side, and
    a first bypass lower surface at a side opposite to the first bypass upper surface, a second distance between the heater lower surface and the first bypass upper surface being greater than a first distance between the heater upper surface and the substrate upper surface.

Configuration 2

The chuck according to configuration 1, wherein
when viewed along a Z-direction perpendicular to the substrate upper surface, the ceramic dielectric substrate includes:
a central region positioned at a center of the ceramic dielectric substrate; and
an outer circumference region positioned outward of the central region, and
the first bypass portion is disposed at a position at which the first bypass portion overlaps the outer circumference region in the Z-direction.

Configuration 3

The chuck according to configuration 1 or 2, wherein
the bypass part further includes a second bypass portion disposed between the substrate upper surface and the substrate lower surface,
the second bypass portion includes:
a second bypass upper surface at the substrate upper surface side; and
a second bypass lower surface at a side opposite to the second bypass upper surface, and
a third distance between the heater lower surface and the second bypass upper surface is greater than a fourth distance between the second bypass lower surface and the first bypass upper surface.

Configuration 4

The chuck according to configuration 3, wherein
when viewed along a Z-direction perpendicular to the substrate upper surface, the ceramic dielectric substrate includes:
a central region positioned at a center of the ceramic dielectric substrate; and
an outer circumference region positioned outward of the central region, and
the second bypass portion is disposed in the central region.

Configuration 5

The chuck according to configuration 3 or 4, further comprising:
a clamping electrode disposed between the substrate upper surface and the heater upper surface,
the clamping electrode including
an electrode upper surface at the substrate upper surface side, and
an electrode lower surface at a side opposite to the electrode upper surface,
a fifth distance between the electrode lower surface and the heater upper surface being less than the fourth distance.

Thus, according to embodiments, an electrostatic chuck is provided in which the effects of the heat from the bypass part on the temperature of the placement surface can be reduced.

The invention has been described with reference to the embodiments. However, the invention is not limited to these embodiments. Any design changes in the above embodiments suitably made by those skilled in the art are also encompassed within the scope of the invention as long as they fall within the spirit of the invention. For example, the shape, the size the material, the disposition and the arrangement or the like of the components included in the electrostatic chuck are not limited to illustrations and can be changed appropriately.

The components included in the embodiments described above can be combined to the extent possible, and these combinations are also encompassed within the scope of the invention as long as they include the features of the invention.

What is claimed is:

1. An electrostatic chuck, comprising:
a ceramic dielectric substrate including
a substrate upper surface on which a process object is placed, and
a substrate lower surface at a side opposite to the substrate upper surface;
a base plate configured to support the ceramic dielectric substrate, the base plate including
a base plate upper surface at the ceramic dielectric substrate side, and
a base plate lower surface at a side opposite to the base plate upper surface;
a heater part disposed between the substrate upper surface and the substrate lower surface, the heater part including at least one heater layer, the heater part heating the ceramic dielectric substrate; and
a bypass part that is a power supply path to the heater part,
the heater part including
a heater upper surface that is an upper surface of a heater layer among the at least one heater layer most proximate to the substrate upper surface, and
a heater lower surface that is a lower surface of a heater layer among the at least one heater layer most proximate to the substrate lower surface,
the bypass part including a first bypass portion disposed lower than the substrate lower surface,
the first bypass portion including
a first bypass upper surface at the substrate lower surface side, and
a first bypass lower surface at a side opposite to the first bypass upper surface,
a second distance between the heater lower surface and the first bypass upper surface being greater than a first distance between the heater upper surface and the substrate upper surface.

2. The chuck according to claim 1, wherein
when viewed along a Z-direction perpendicular to the substrate upper surface, the ceramic dielectric substrate includes:
a central region positioned at a center of the ceramic dielectric substrate; and
an outer circumference region positioned outward of the central region, and
the first bypass portion is disposed at a position at which the first bypass portion overlaps the outer circumference region in the Z-direction.

3. The chuck according to claim 1, wherein
the bypass part further includes a second bypass portion disposed between the substrate upper surface and the substrate lower surface,
the second bypass portion includes:
a second bypass upper surface at the substrate upper surface side; and
a second bypass lower surface at a side opposite to the second bypass upper surface, and
a third distance between the heater lower surface and the second bypass upper surface is greater than a fourth distance between the second bypass lower surface and the first bypass upper surface.

4. The chuck according to claim 3, wherein
when viewed along a Z-direction perpendicular to the substrate upper surface, the ceramic dielectric substrate includes:
  a central region positioned at a center of the ceramic dielectric substrate; and
  an outer circumference region positioned outward of the central region, and
the second bypass portion is disposed in the central region.

5. The chuck according to claim 3, further comprising:
a clamping electrode disposed between the substrate upper surface and the heater upper surface,
the clamping electrode including
  an electrode upper surface at the substrate upper surface side, and
  an electrode lower surface at a side opposite to the electrode upper surface,
a fifth distance between the electrode lower surface and the heater upper surface being less than the fourth distance.

\* \* \* \* \*